(12) United States Patent
Chung et al.

(10) Patent No.: US 7,960,761 B2
(45) Date of Patent: Jun. 14, 2011

(54) SEMICONDUCTOR DEVICE HAVING A RECESS CHANNEL TRANSISTOR

(75) Inventors: Sung Woong Chung, Icheon-si (KR); Sang Don Lee, Guri-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 12/615,210

(22) Filed: Nov. 9, 2009

(65) Prior Publication Data

US 2010/0117149 A1      May 13, 2010

Related U.S. Application Data

(62) Division of application No. 11/529,420, filed on Sep. 29, 2006, now Pat. No. 7,615,449.

(30) Foreign Application Priority Data

Apr. 28, 2006   (KR) .................. 10-2006-0038825

(51) Int. Cl.
*H01L 29/78* (2006.01)
*H01L 29/94* (2006.01)

(52) U.S. Cl. . 257/220; 257/328; 257/330; 257/E21.429; 257/E21.621; 257/E21.628; 257/E29.26; 438/209; 438/259; 438/268; 438/270

(58) Field of Classification Search .................. 257/220, 257/328, 330, E21.429, E21.621, E21.628, 257/E29.26; 438/209, 259, 268, 270
See application file for complete search history.

(56) References Cited

U.S. PATENT DOCUMENTS

| | | | |
|---|---|---|---|
| 6,476,444 B1 | 11/2002 | Min | |
| 2005/0077553 A1 | 4/2005 | Kim et al. | |
| 2005/0250279 A1* | 11/2005 | Son et al. | 438/216 |
| 2006/0160302 A1 | 7/2006 | Kim et al. | |
| 2006/0192249 A1* | 8/2006 | Kim et al. | 257/330 |
| 2006/0240607 A1 | 10/2006 | Zhang et al. | |
| 2007/0173007 A1* | 7/2007 | Lee et al. | 438/209 |

FOREIGN PATENT DOCUMENTS

| | | |
|---|---|---|
| KR | 1020060000275 A | 1/2006 |
| TW | 586230 | 5/2004 |
| TW | 1228828 | 3/2005 |
| TW | 1246185 | 12/2005 |
| TW | 1247419 | 1/2006 |

OTHER PUBLICATIONS

Korean Notice of Rejection for App. No. 10-2006-0038825, sent Apr. 24, 2007.

* cited by examiner

*Primary Examiner* — Dao H Nguyen
(74) *Attorney, Agent, or Firm* — Kilpatrick Townsend & Stockton LLP (57) ABSTRACT

The semiconductor device having a recess channel transistor includes a device isolation structure formed in a semiconductor substrate to define an active region having a recess region at a lower part of sidewalls thereof and a recess channel region formed in the semiconductor substrate under the active region. A method for fabricating the semiconductor device includes forming a device isolation structure in a semiconductor substrate to form an active region having a recess region at a lower part of sidewalls thereof, a gate insulating film formed over the semiconductor substrate including the recess channel region, and a gate electrode formed over the gate insulating film to fill up the recess channel region.

3 Claims, 14 Drawing Sheets

SEMICONDUCTOR DEVICE HAVING A RECESS CHANNEL TRANSISTOR

CROSS-REFERENCES TO RELATED APPLICATIONS

The present application is a divisional of U.S. patent application Ser. No. 11/529,420, filed on Sep. 29, 2006, which claims priority to Korean patent application number 10-2006-0038825, filed on Apr. 28, 2006, both of which are incorporated by reference in their entirety.

BACKGROUND OF THE INVENTION

The present invention relates to a memory device. More particularly, the present invention relates to a semiconductor device having a recess channel region including a vertical Silicon-on-Insulator ("SOI") channel structure and a method for fabricating the same.

When a channel length of a cell transistor is decreased, ion concentration of a cell channel region is generally increased in order to maintain the threshold voltage of the cell transistor. An electric field in source/drain regions of the cell transistor is enhanced to increase leakage current. This results in degradation of the refresh characteristics of a DRAM structure. Therefore, there is a need for semiconductor devices in which the refresh characteristics are improved.

Figure 1:
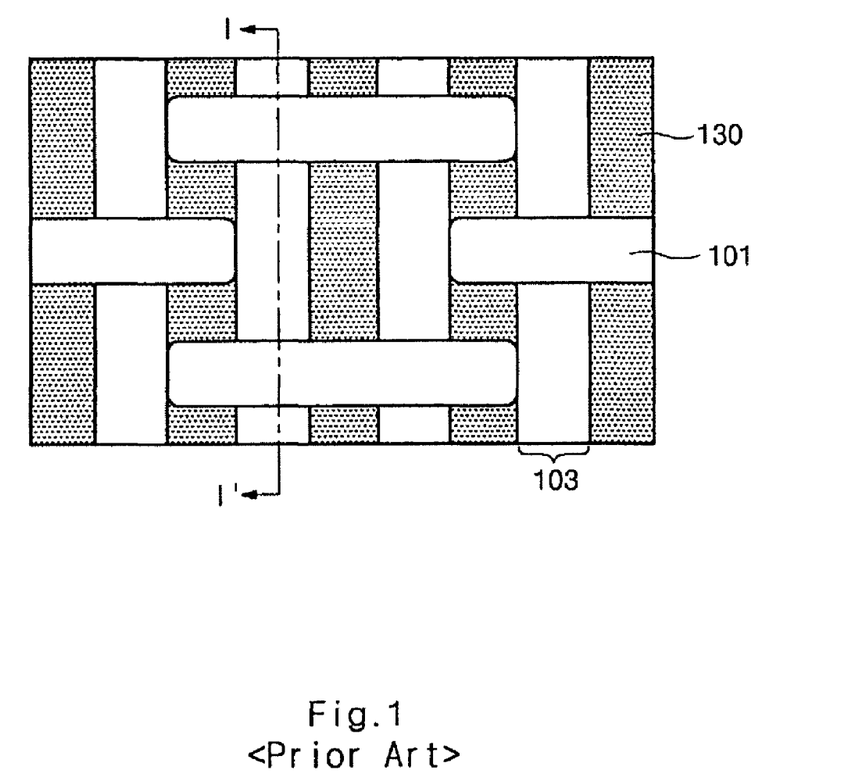
FIG. 1 is a simplified layout of a conventional semiconductor device.

FIG. 1 is a simplified layout of a semiconductor device. The semiconductor device includes an active region 101 and a gate region 103. The active region is defined by a device isolation structure 130.

Figure 2A:
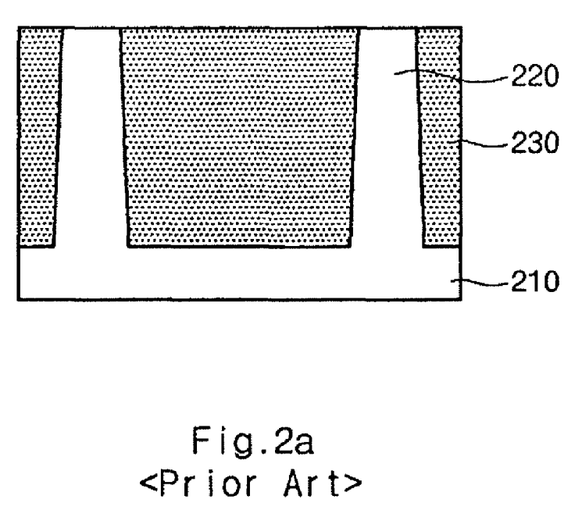
FIGS. 2a through 2c are simplified cross-sectional views illustrating a conventional method for fabricating a semiconductor device.
Figure 2B:
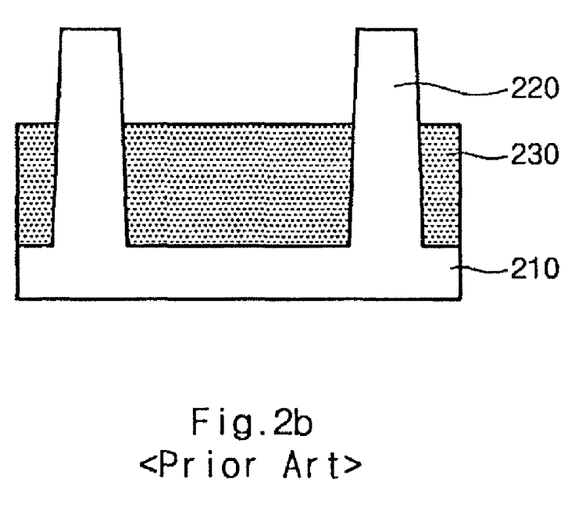
Figure 2C:
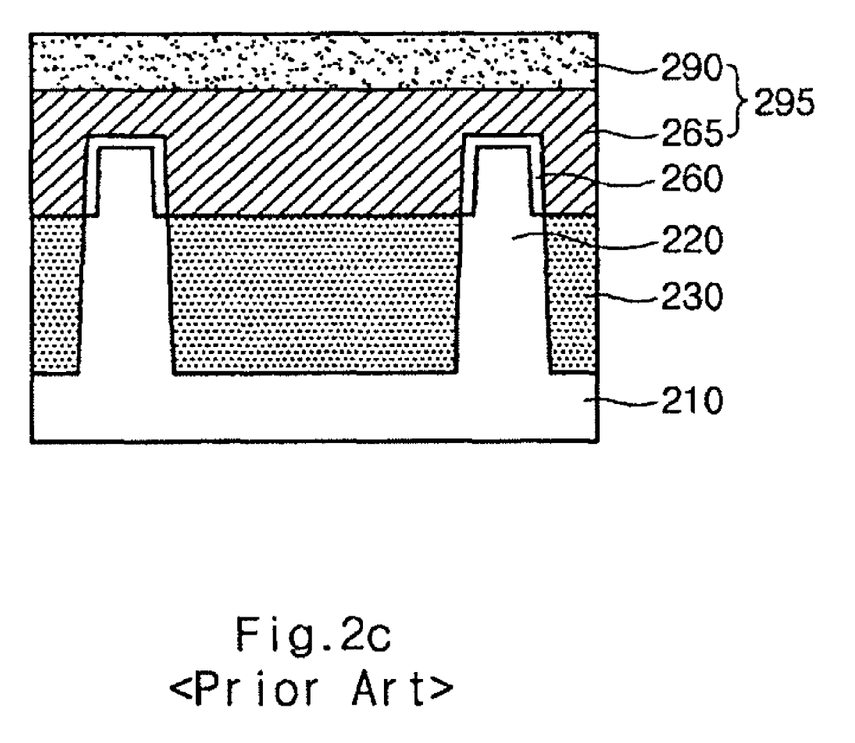

FIGS. 2a through 2c are simplified cross-sectional views illustrating a method for fabricating a semiconductor device, wherein FIGS. 2a through 2c are cross-sectional views taken along the line I-I' of FIG. 1. A semiconductor substrate 210 having a pad insulating film (not shown) is etched using a device isolation mask (not shown) to form a trench (not shown) defining a fin-type active region 220. An insulating film for device isolation (not shown) is formed to fill the trench. The insulating film for device isolation is polished until the pad insulating film is exposed to form a device isolation structure 230. The pad insulating film is removed to expose the top surface of the fin-type active region 220.

Referring to FIG. 2b, a predetermined thickness of the device isolation structure 230 is etched using a recess gate mask (not shown) defining a gate region 103 shown in FIG. 1 to protrude an upper part of the fin-type active region 220 over the device isolation structure 230.

Referring to FIG. 2c, a gate insulating film 260 is formed over the protruded fin-type active region 220. A gate structure 295 is formed over the gate insulating film 260 of the gate region 103 shown in FIG. 1 to fill the protruded fin-type active region 220, wherein the gate structure 295 comprises a stacked structure of a gate electrode 265 and a gate hard mask layer pattern 290.

Figure 3:
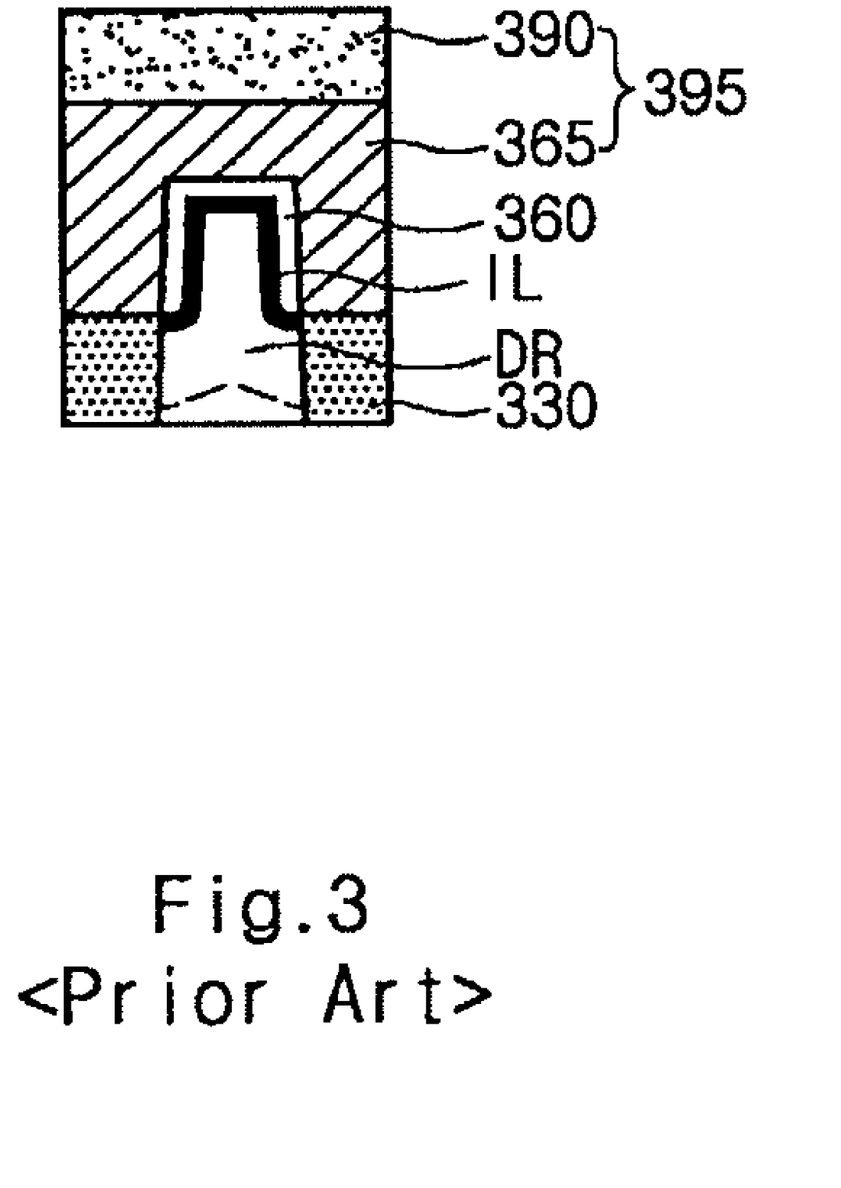
FIG. 3 is a simplified cross-sectional view of a conventional semiconductor device.

FIG. 3 is a simplified cross-sectional view illustrating a semiconductor device. If a voltage above the threshold voltage is applied to the gate, an inversion layer IL and a depletion region DR are formed in a semiconductor substrate under the gate insulating film 360.

According to the above conventional method for fabricating a semiconductor device, device characteristics such as the gate potential and ion concentration of a cell channel structure have to be adjusted in order to secure a desired Off-characteristic of the device, which causes increased leakage current from a storage node to the body of the semiconductor substrate. Accordingly, it is difficult to obtain proper refresh characteristics of the device due to the increased leakage current.

BRIEF SUMMARY OF THE INVENTION

Embodiments of the present invention are directed to a semiconductor device having a recess channel transistor with an increased channel area. According to one embodiment, the recess channel transistor is provided with a recess channel region including a vertical Silicon-on-Insulator ("SOI") channel structure.

In one embodiment of the present invention, a semiconductor device comprises a device isolation structure formed in a semiconductor substrate to define an active region having a recess region at a lower part of sidewalls thereof; a recess channel region formed in the semiconductor substrate under the active region, the recess channel region having a vertical Silicon-on-Insulator ("SOI") channel structure formed at a sidewall of the device isolation structure in a longitudinal direction of a gate region; a gate insulating film formed over the semiconductor substrate including the recess channel region; and a gate electrode formed over the gate insulating film to fill up the recess channel region.

According to another embodiment of the present invention, a method for fabricating a semiconductor device includes forming a device isolation structure in a semiconductor substrate to form an active region having a recess region at a lower part of sidewalls thereof; forming a hard mask layer pattern defining a recess gate region over the semiconductor substrate and the device isolation structure; forming recess channel spacers at the sidewalls of the recess gate region; etching the semiconductor substrate exposed at the bottom of the recess gate region by using the recess channel spacers and the hard mask layer pattern as an etching mask to form a recess, wherein the recess includes a recess channel region having a vertical Silicon-on-Insulator ("SOI") channel structure formed at a sidewall of the device isolation structure in a longitudinal direction of the gate region; removing the recess channel spacers and the hard mask layer pattern to expose the semiconductor substrate; forming a gate insulating film over the exposed semiconductor substrate; and forming a gate structure including a stacked structure of a gate hard mask layer pattern and a gate electrode filling up the recess channel region over the gate insulating film of the gate region.

DETAILED DESCRIPTION OF THE INVENTION

The present invention relates to semiconductor devices having a recess channel transistor with a recess channel region including a vertical SOI channel structure. The recess channel transistor has an active region having a recess region at a lower part of sidewalls of the active region, a recess channel region that has the vertical SOI channel structure formed at a sidewall of the device isolation structure in a longitudinal direction of a gate region, and a gate structure that fills the recess channel region. Accordingly, the recess channel transistor provides significantly improved refresh characteristics due to reducing leakage current flowing from storage nodes to body of the semiconductor substrate and improved short channel effect ("SCE") because of a sufficiently securing channel area.

Figure 4:
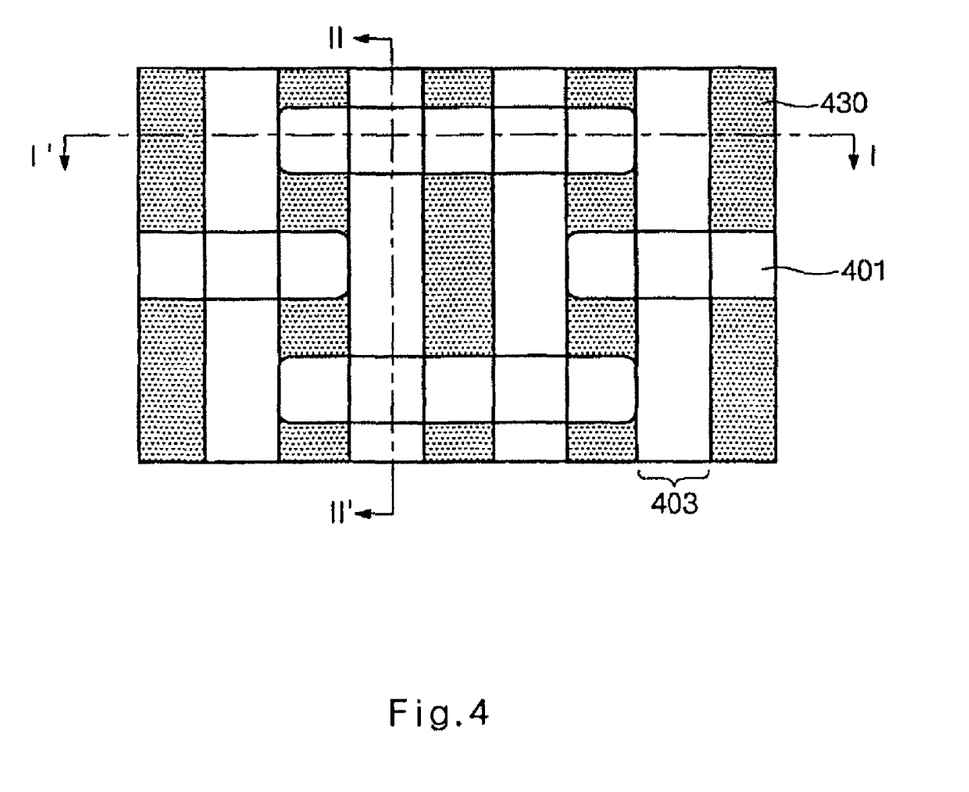
FIG. 4 is a simplified layout of a semiconductor device according to one embodiment of the present invention.

FIG. 4 is a simplified layout of a semiconductor device according to one embodiment of the present invention. The semiconductor device includes an active region 401 and a gate region 403. A device isolation structure 430 defines the active region 401.

Figure 5:
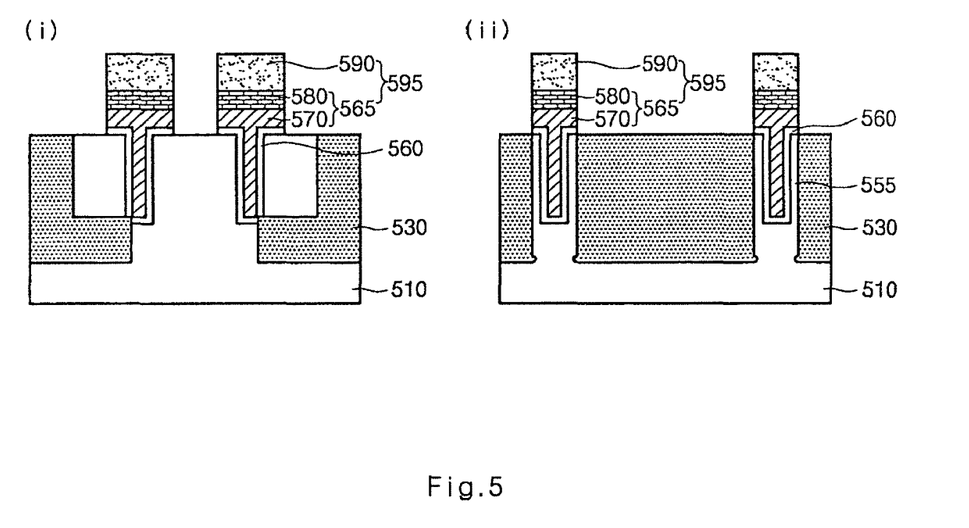
FIGS. 5 and 6 are simplified cross-sectional views of a semiconductor device according to one embodiment of the present invention.

FIG. 5 is a simplified cross-sectional view of a semiconductor device according to one embodiment of the present invention, wherein FIG. 5(i) is a cross-sectional view taken along a latitudinal direction in accordance with the line I-I' of FIG. 4 and FIG. 5(ii) is a cross-sectional view taken along a longitudinal direction in accordance with the line II-II' of FIG. 4. A device isolation structure 530 defines an active region 401 shown in FIG. 4 having a recess region at a lower part of sidewalls of the active region 401. The recess region includes a portion of a storage node junction region 607 shown in FIG. 6 and a channel region 609 adjacent to the storage node junction region 607 under a semiconductor substrate 510. A recess channel region (not shown) includes vertical Silicon-on-Insulator ("SOI") channel structures 555 formed at a sidewall of both device isolation structures 530 in a longitudinal directional of a gate region 403 shown in FIG. 4. A gate insulating film 560 is formed over the active region 401 shown in FIG. 4 including the recess channel region. A gate structure 595 is formed over the gate insulating film 560 of the gate region 403 shown in FIG. 4 to fill up the recess channel region. Here, the gate structure 595 includes a stacked structure of a gate electrode 565 and a gate hard mask layer pattern 590. The gate electrode 565 includes a stacked structure of a lower gate electrode 570 and an upper gate electrode 580. In one embodiment of the present invention, the gate insulating film 560 is formed using $O_2$, $H_2O$, $O_3$ and combinations thereof with its thickness ranging from about 1 nm to about 10 nm. In addition, the lower gate electrode 570 includes a polysilicon doped with impurities such as P or B. The upper gate electrode 580 includes one selected from the group consisting of a titanium (Ti) layer, a titanium nitride (TiN) film, a tungsten (W) layer, an aluminum (Al) layer, a copper (cu) layer, a tungsten silicide ($WSi_x$) layer and combinations thereof. In another embodiment, the gate insulating film 560 is selected from the group consisting of a silicon nitride film, a hafnium oxide film, an aluminum oxide film, a zirconium oxide film, a silicon nitride film and combinations thereof with its thickness ranging from about 1 nm to about 20 nm.

Figure 6:
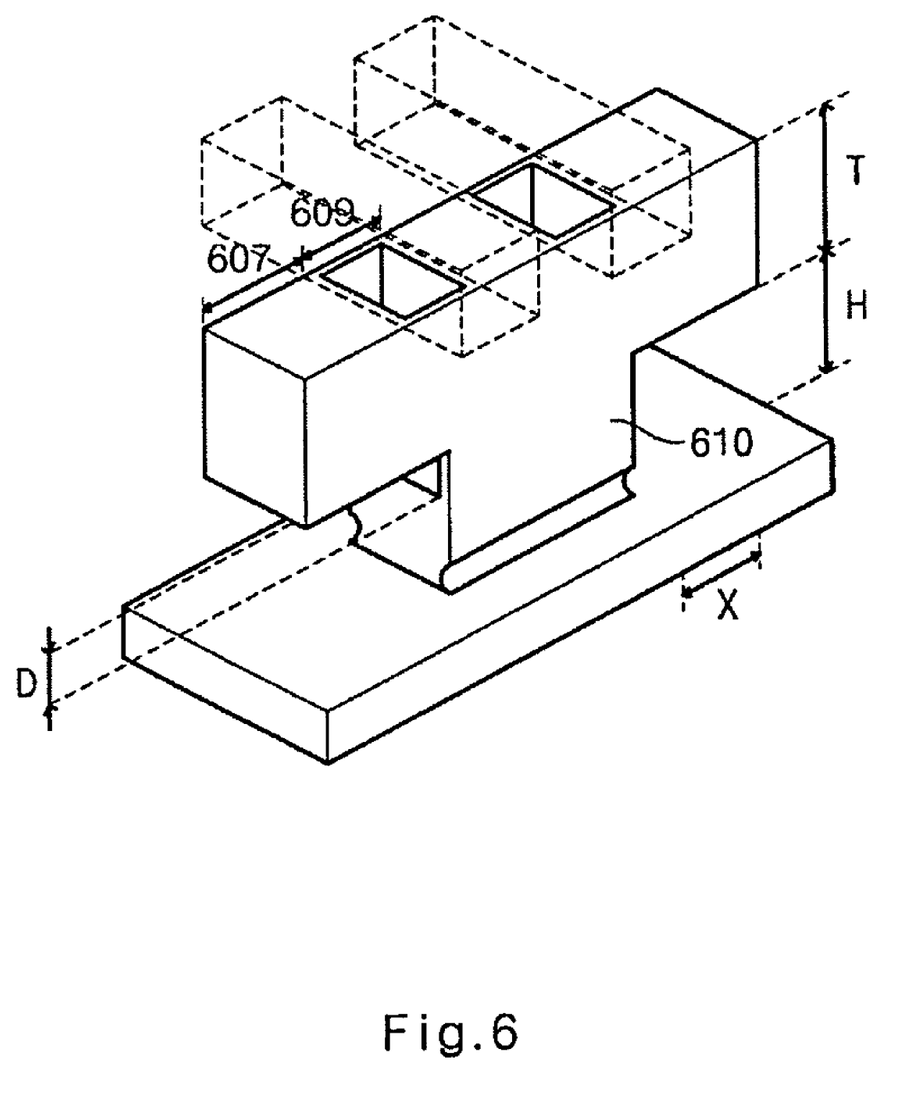

FIG. 6 is a perspective, cross-sectional view of a semiconductor device according to one embodiment of the present invention. It shows a recess channel region including the active region 401 shown in FIG. 4 having a recess region at a lower part of sidewalls of the active region 401 and the vertical SOI channel structures 555 shown in FIG. 5. Here, the recess region includes a portion of a storage node junction region 607 and a channel region 609 adjacent to the storage node junction region 607.

Referring to FIG. 6, depth D is a depth from the semiconductor substrate 610 under the storage node junction region 607 to the bottom of the recess channel region. The distance D is at least 0 (i.e. $0 \leq$; D<H) in order to prevent direct connection from a storage node to body of the semiconductor substrate 610. If the distance D is less than 0 (i.e. $-\frac{1}{2}T \leq D < 0$), it is expected to prevent junction capacitance and junction leakage current because the semiconductor substrate 610 under the storage node junction region 607 is recessed. Distance X is a distance of the removed semiconductor substrate 610 in a longitudinal direction of the active region 401 shown in FIG. 4. The distance X includes a portion of the storage node junction region 607 and the channel region 609 adjacent to the storage node junction region 607. In addition, the distance X can extend from the storage node junction region 607 to the neighboring channel region 609. Depth T is a depth of the semiconductor substrate 610 of the storage node junction region 607. In fact, the depth T is the same as a depth of the vertical SOI channel structure 555 shown in FIG. 5. Accordingly, the depth T can be adjusted considering size of channel area or amount of the operating current. Depth H is a depth of the recessed semiconductor substrate 610 under the active region 401 shown in FIG. 4. The depth H is at least greater than the depth D.

In one embodiment of the present invention, the storage node is not directly connected with the body of the semiconductor substrate 610 to prevent gate-induced drain leakage ("GIDL") current, which occurs due to the storage node and the gate voltage, from flowing into the body of the semiconductor substrate 610. As a result, reducing the stored charges in the storage node can be prevented. In addition, gate channel is formed at the vertical SOI channel structure 555 shown in FIG. 5 to improve the device characteristics such as short channel effect ("SCE"), body effect, and operating current. Accordingly, it is expected to improve the refresh characteristics of the device.

Figure 7A:
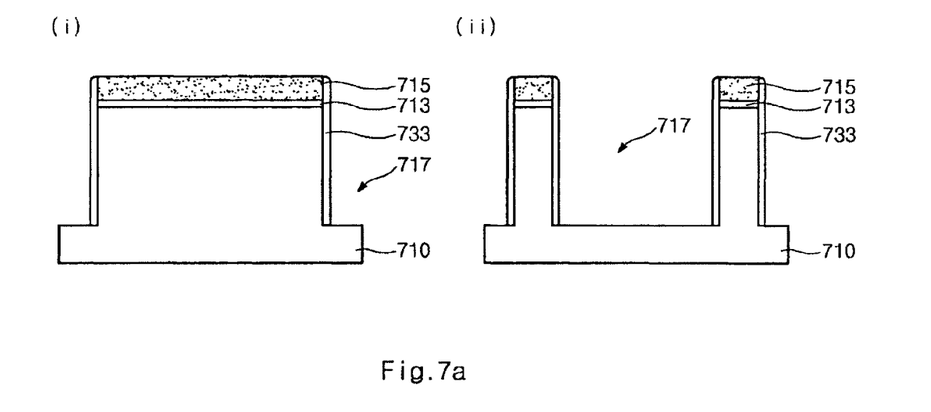
FIGS. 7a through 7i are simplified cross-sectional views illustrating a method for fabricating a semiconductor device according to one embodiment of the present invention.

FIGS. 7a through 7i are simplified cross-sectional views illustrating a method for fabricating a semiconductor device according to one embodiment of the present invention, wherein FIGS. 7a(i) through 7i(i) are cross-sectional views taken along a latitudinal direction in accordance with the line I-I' of FIG. 4 and FIGS. 7a(ii) through 7i(ii) are cross-sectional views taken along a longitudinal direction in accordance with the line II-II' of FIG. 4. A pad oxide film 713 and a pad nitride film 715 are formed over a semiconductor substrate 710. The pad nitride film 715, the pad oxide film 713, and the semiconductor substrate 710 are etched using a device isolation mask (not shown) as an etching mask to form a first trench 717 defining an active region 401 shown in FIG. 4. A first insulating film (not shown) is formed over an entire surface of the resultant (i.e. over the first trench 717 and the semiconductor substrate 710). The first insulating film is etched to form first spacers 733 at sidewalls of the first trench 717. In one embodiment of the present invention, the first insulating film is selected from the group consisting of a silicon nitride film, a silicon oxide film, a silicon film, and combinations thereof by a chemical vapor deposition ("CVD") method or an atomic layer deposition ("ALD") method. A thickness of the first insulating film ranges from about 1 nm to 100 nm. In addition, the etching process for the first insulating film is performed by a dry etching method. In particular, the etching process for forming the first spacer 733 is performed by a plasma etching method using one selected from the group consisting of $C_xF_yH_z$, $O_2$, HCl, Ar, He and combinations thereof.

Figure 7B:
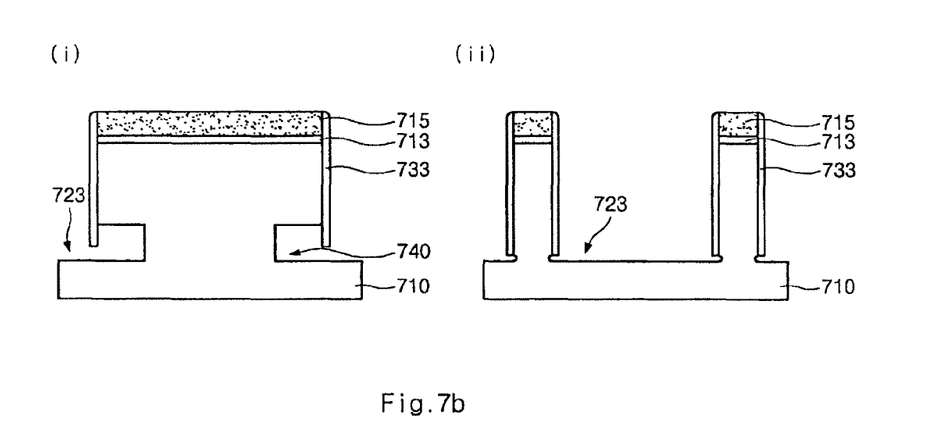

Referring to FIG. 7b, the semiconductor substrate 710 exposed under the first trench 717 is etched to form a second trench 723 including an under-cut space 740 where the semiconductor substrate 710 under a predetermined region is removed. In one embodiment of the present invention, the etching process for forming the second trench 723 is performed by exposing the semiconductor substrate 710 exposed under the first trench 717 at an atmosphere of a mixture gas of HCl and $H_2$ and at a temperature ranging from about 500° C. to about 1,000° C. In addition, the predetermined region includes a portion of the storage node junction region 607 and the channel region 609 adjacent to the storage node junction region 607. Here, the under-cut space 740 is formed due to different etch rates in accordance with silicon crystal planes during the removing process for the semiconductor substrate 710. In particular, since the etch rate of the semiconductor substrate 710 in a longitudinal direction of the active region 401 shown in FIG. 4 is relatively faster than that of any crystal plane, the under-cut space 740 where the semiconductor substrate 710 under the predetermined region is removed can be formed.

Figure 7C:
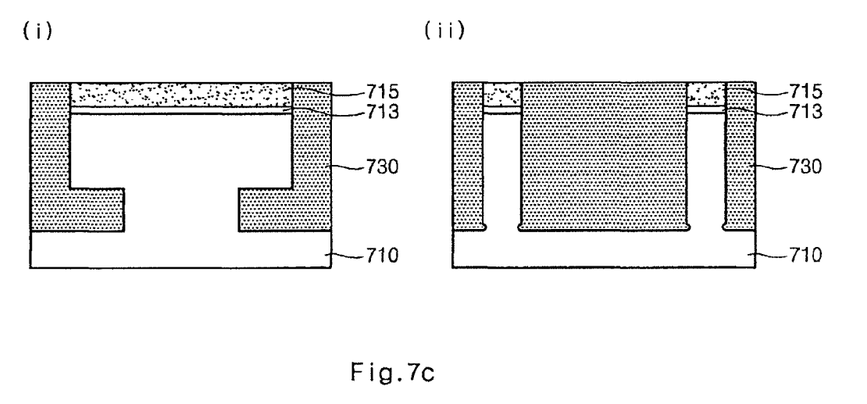

Referring to FIG. 7c, the first spacer 733 is removed. An insulating film for device isolation (not shown) is formed to fill up the second trench 723 including the under-cut space 740. The insulating film for device isolation is polished until the pad nitride film 715 is exposed to form a device isolation structure 730. In one embodiment of the present invention, without the removing process for the first spacer 733, the insulating film for device isolation can be formed to fill up the second trench 723 including the under-cut space 740. In addition, a thermal oxide film (not shown) can further be formed at the interface of the device isolation structure 730 and the second trench 723 including the under-cut space 740. Here, the semiconductor substrate 710 is exposed at one selected from the group consisting of $H_2O$, $O_2$, $H_2$, $O_3$ and combinations thereof and at a temperature ranging from about 200° C. to about 1,000° c to form the thermal oxide film. In another embodiment, the insulating film for device isolation is formed of a silicon oxide film by a high density plasma ("HDP") method or a CVD method. In addition, the polishing process for forming the device isolation structure 730 is performed by a chemical mechanical planarization ("CMP") method.

Figure 7D:
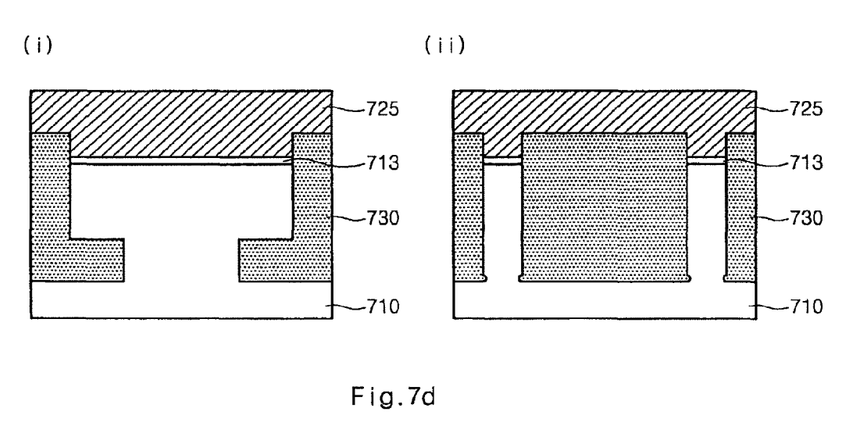

Referring to FIG. 7d, the pad nitride film 715 is removed. A hard mask layer 725 is formed over an entire surface of the resultant (i.e. over the device isolation structure 730 and the semiconductor substrate 710). In one embodiment of the present invention, the removing process for the pad nitride film 715 is performed by a wet etching method using a heated $H_3PO_4$. The hard mask layer 725 is selected from the group consisting of a polysilicon layer, an amorphous carbon film, a nitride film, a SiON film, and combinations thereof with relatively different etch selectivity against the device isolation structure 730.

Figure 7E:
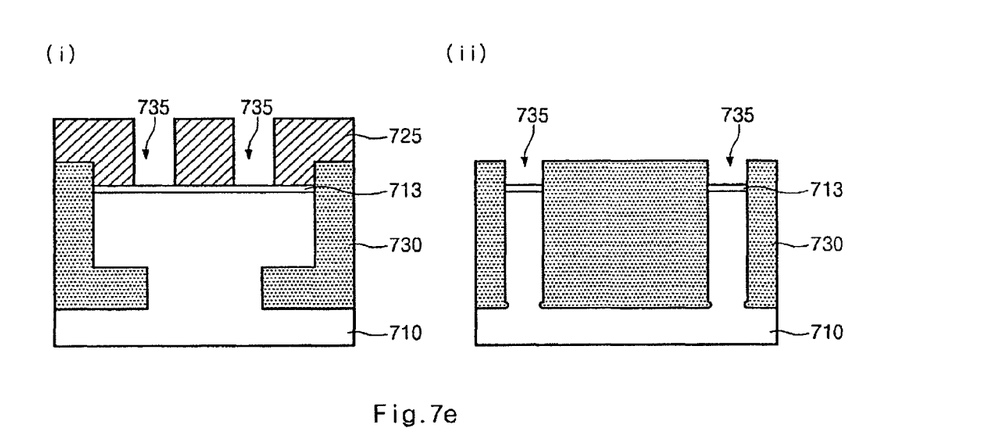
Figure 7F:
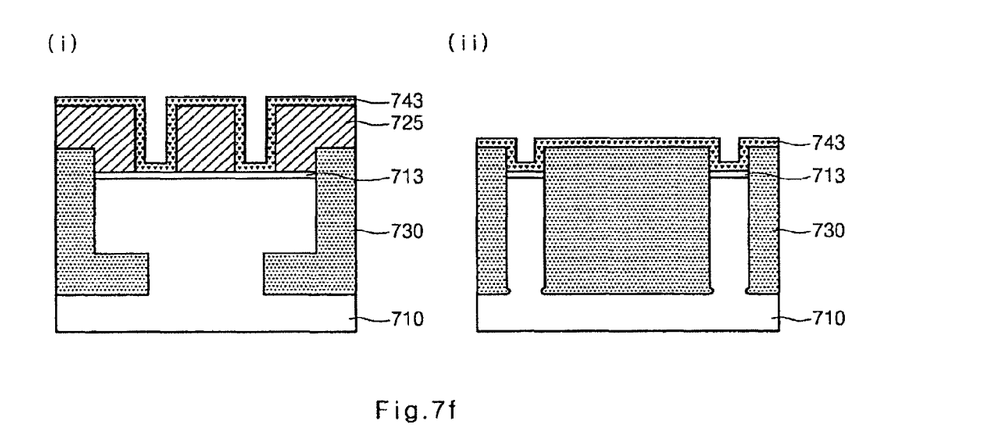

Referring to FIGS. 7e and 7f, the hard mask layer 725 is etched using a recess gate mask (not shown) corresponding to the gate region 403 shown in FIG. 4 as an etching mask to form a recess gate region 735. A second insulating film 743 is formed over an entire surface of the resultant (i.e. over the hard mask layer 725 and the recess gate region 735). In one embodiment of the present invention, the second insulating film 743 is formed of the group consisting of a silicon nitride film, a silicon oxide film, a polysilicon layer, and combinations thereof with its thickness ranging from about 1 nm to about 50 nm. The second insulating film 743 is formed by a CVD method using a source gas selected from the group consisting of $SiH_4$, $O_2$, $Si(OC_2H_5)4$, $SiH_2Cl_2$, $NH_3$, $N_2$, $H_3$ and combinations thereof.

Figure 7G:
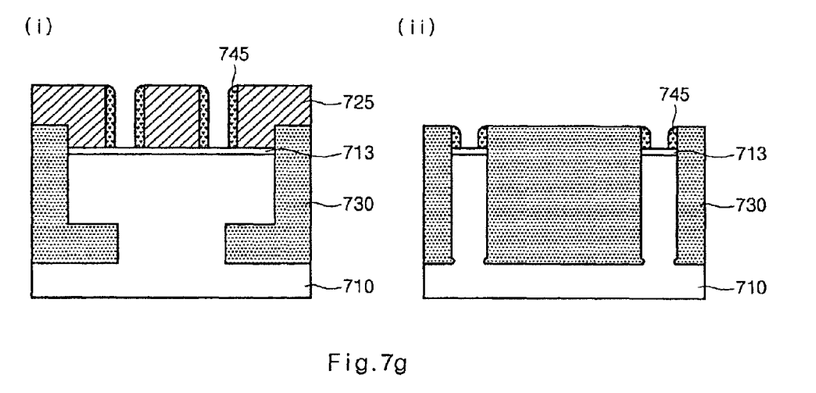
Figure 7H:
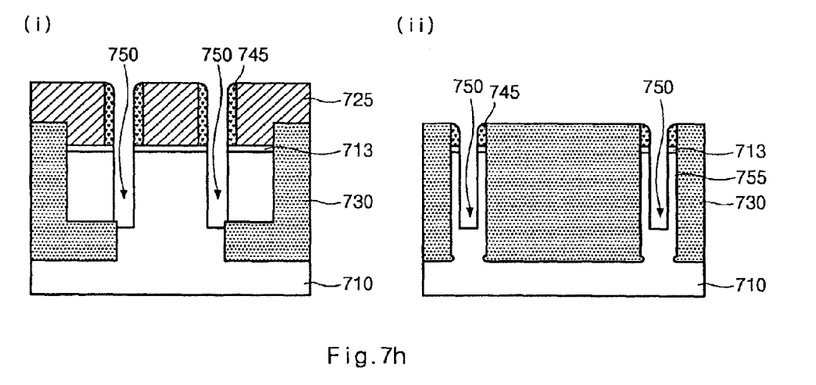

Referring to FIGS. 7g and 7h, the second insulating film 743 is etched to form second spacers 745 at sidewalls of the recess gate region 735. The pad oxide film 713 and the semiconductor substrate 710 exposed under the recess gate region 735 are etched using the second spacers 745 as an etching mask to form a recess 750. At this time, vertical SOI channel structures 755 are formed at a sidewall of both device isolation structures 730 in the recess 750 in a longitudinal direction of a gate region 403 shown in FIG. 4. In one embodiment of the present invention, the etching process for the second insulating film 743 is performed by a plasma etching method using a gas selected from the group consisting of $C_xF_yH_z$, $O_2$, HCl, Ar, He, and combinations thereof. In addition, the etching process for forming the recess 750 is performed by a plasma etching method.

Figure 7I:
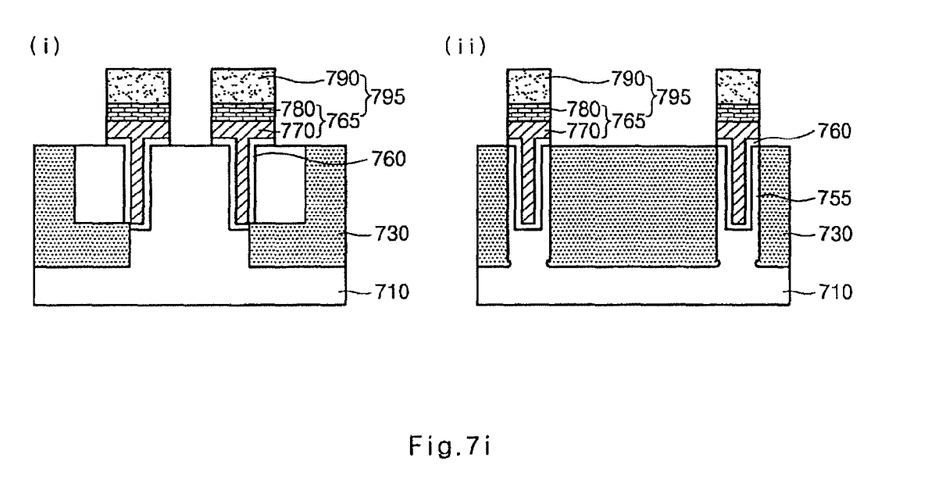

Referring to FIG. 7i, the second spacer 745, the hard mask layer 725 and the pad oxide film 713 are removed to expose the semiconductor substrate 710 including the recess 750. A gate insulating film 760 is formed over the exposed semiconductor substrate 710. A lower-gate conductive layer (not shown) is formed to fill up the recess 750. An upper gate conductive layer (not shown) and a gate hard mask layer (not shown) are formed over the lower gate conductive layer. The gate hard mask layer, the upper gate conductive layer, the lower gate conductive layer, and the gate insulating film 760 are patterned using a gate mask (not shown) to form a gate structure 795 including a stacked structure of a gate electrode 765 and a gate hard mask layer pattern 790. In one embodiment of the present invention, a process for cleaning a surface of the exposed semiconductor substrate 710 by using a solution including HF may be further performed before the process for forming the gate insulating film 760. In addition, the gate insulating film 760 is formed using one selected from the group consisting of $O_2$, $H_2O$, $O_3$ and combinations thereof with its thickness ranging from about 1 nm to about 10 nm. In another embodiment, the lower gate conductive layer is formed of a polysilicon layer doped with impurities including P or B. Here, the doped polysilicon layer may be formed by implanting impurity ions in an undoped polysilicon layer or by using a silicon source gas and an impurity source gas including P or B. In addition, the upper gate conductive layer is selected from the group consisting of a titanium (Ti) layer, a titanium nitride (TiN) film, a tungsten (W) layer, an aluminum (Al) layer, a cupper (cu) layer, a tungsten silicide ($WSi_x$) layer and combinations thereof. In other embodiment, gate insulating film 760 is selected from the group consisting of a silicon oxide film, a hafnium oxide film, an aluminum oxide film, a zirconium oxide film, a silicon nitride film, and combinations thereof with its thickness ranging from about 1 nm to about 20 nm. On the other hand, in order to increase an effective channel length of the device, a silicon layer (not shown) is be grown using the semiconductor substrate 710 exposed at both sides of the gate structure 795 as a seed layer with its thickness ranging from about 200 Å to about 1,000 Å. The grown silicon layer is implanted with impurity ions to form source/drain regions. Therefore, there is a height difference between the channel region and the source/drain regions.

In addition, subsequent processes such as a process for forming gate spacers, a process for forming a landing plug, a process for forming a bit line contact and a bit line, a process for forming a capacitor, and a process for forming an interconnect may be performed.

FIGS. 8a through 8d are simplified cross-sectional views illustrating a method for fabricating a semiconductor device according to another embodiment of the present invention. In the method, a recess region where a semiconductor substrate at a lower part of sidewalls of an active region is to be removed in a subsequent process is formed of a SiGe layer in order to easily remove the semiconductor substrate corresponding to a recess region. Here, FIG. 8a(i) through 8d(i) are cross-sectional views taken along a latitudinal direction in accordance with the line I-I' of FIG. 4, and FIGS. 8a(ii) through 8d(ii) are cross-sectional views taken along a longitudinal direction in accordance with the lines II-II' of FIG. 4.

Figure 8A:
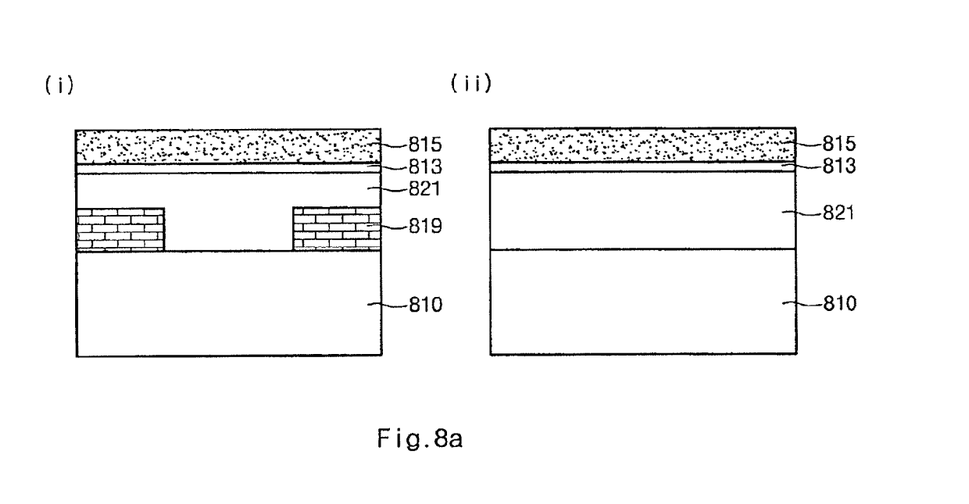
FIGS. 8a through 8d are simplified cross-sectional views illustrating a method for fabricating a semiconductor device according to another embodiment of the present invention.

Referring to FIG. 8a, a cleaning process is performed on a surface of the semiconductor substrate 810. A SiGe layer 819 is formed over the semiconductor substrate 810. The SiGe layer 819 is selectively removed using a mask (not shown) covering the recess region to expose the semiconductor substrate 810. A silicon layer 821 is formed using the exposed semiconductor substrate 810 as a seed layer to fill up the SiGe layer 819. A pad oxide film 813 and a pad nitride film 815 are formed over the silicon layer 821. In one embodiment of the present invention, the removing process for the SiGe layer 819 is performed by a dry etching method. In addition, the recess region includes a portion of the storage node junction region 607 shown in FIG. 6 and the channel region 609 adjacent to the storage node junction region 607 in a longitudinal direction 401 shown in FIG. 4.

Figure 8B:
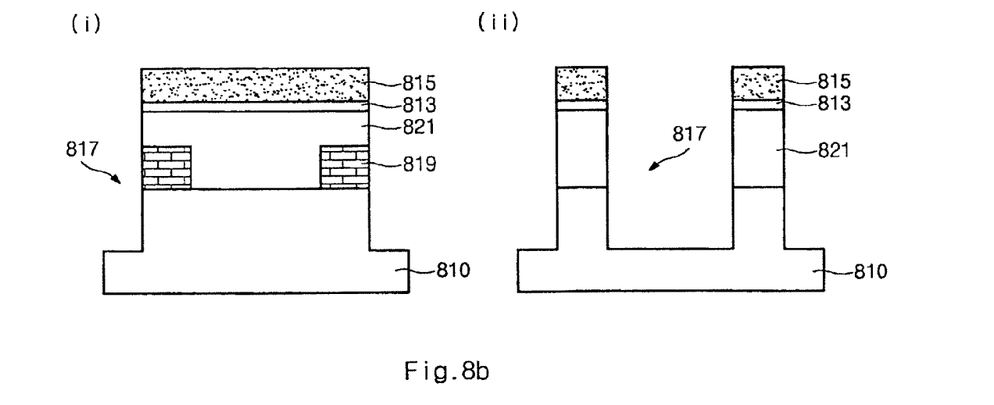
Figure 8C:
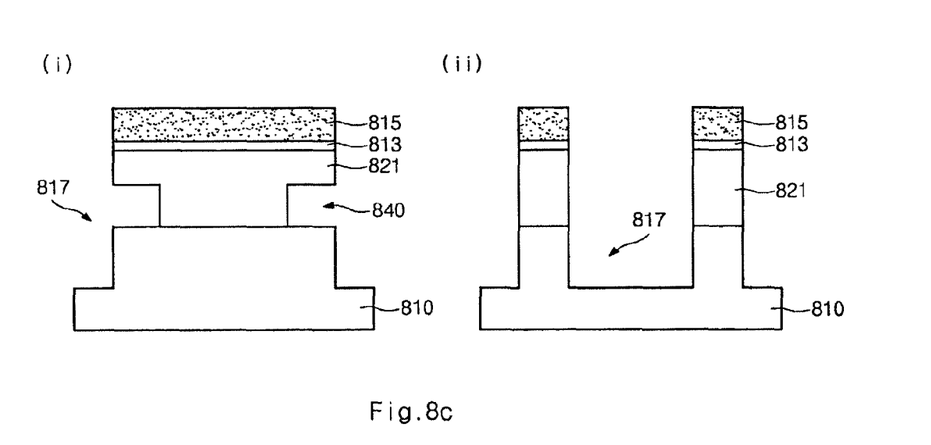

Referring to FIGS. 8b and 8c, the pad nitride film 815, the pad oxide film 813, the silicon layer 821, and the semiconductor substrate 810 are etched using a device isolation mask (not shown) to form a trench defining the active region 401 shown in FIG. 4. At this time, the SiGe layer 819 is exposed at sidewalls of the trench 817. The SiGe layer exposed at the sidewalls of the trench 817 is etched to form an under-cut space 840. In one embodiment of the present invention, since an etch rate of the SiGe layer 819 is faster than that of the semiconductor substrate 810, the under-cut space 840 can be formed. In addition, a ratio of the etch rate of the SiGe layer 819 to that of the semiconductor substrate 810 is at least 10.

Figure 8D:
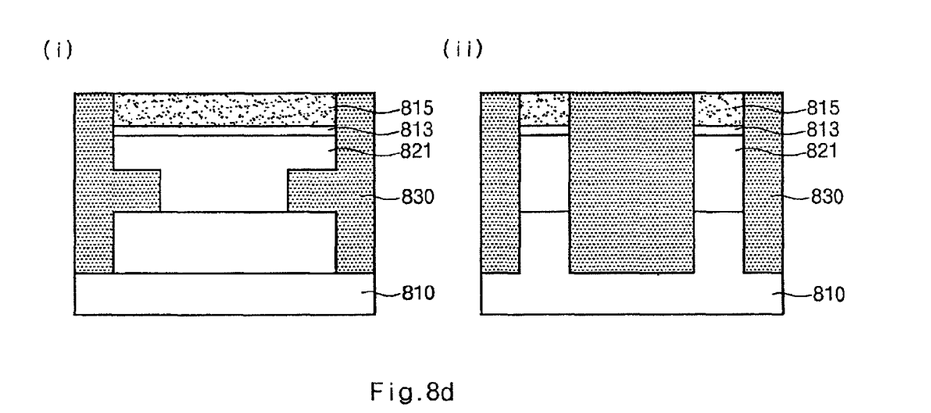

Referring to FIG. 8d, an insulating film for device isolation (not shown) is formed to fill up the trench 817 including the under-cut space 840. The insulating film for device isolation is polished until the pad nitride film 815 is exposed to form a device isolation structure 830. In one embodiment of the present invention, a thermal oxide film (not shown) can be further formed at the interface of the device isolation structure 830 and the trench 817 including the under-cut space 840. Here, the semiconductor substrate 810 is exposed at one selected from the group consisting of $H_2O$, $O_2$, $H_2$, $O_3$ and combinations thereof and at a temperature ranging from about 200° C. to about 1,000° C. to from the thermal oxide film. In addition, subsequent processes may be performed by the method for fabricating a semiconductor device shown in FIGS. 7d through 7i.

As described above, the semiconductor device having the active region having a recess region at a lower part of sidewalls of the active region and the recess channel region including vertical SOI channel structures and the method for fabricating the same can obtain relatively large driving current. In addition, the semiconductor substrate under the storage node is removed to prevent the direct contact between the storage node and the body of the semiconductor substrate, thereby structurally reducing the leakage current flowing from the storage node to the body. Accordingly, there is the substantial improvement for the refresh characteristic of the device. In addition, since the semiconductor device has the recess channel region including the vertical SOI channel structures, it can be easily applicable to the shrunk semiconductor device according to the design rule. The lowering of threshold voltage due to drain voltage, short channel effect, body effect, and gate On/Off characteristics can be improved because of the SOI structure. According to the present invention, the semiconductor device has extendibility capable of securing substantial channel area of the device despite shrinkage of its design rules. The conventional gate mask may be used for forming the recess gate region. As a result, the process cost can be saved. The process is made simple, which results in decreasing the number of defected devices.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A semiconductor device comprising:
a device isolation structure formed in a semiconductor substrate to define an active region having a recess region at a lower part of sidewalls of the active region;
a recess channel region formed in the semiconductor substrate under the active region exposing a partial portion of the device isolation structure, the recess channel region having a vertical Silicon-on-Insulator ("SOI") channel structure formed at a sidewall of the device isolation structure in a longitudinal direction of a gate region;
a gate insulating film formed over the semiconductor substrate including the recess channel region; and
a gate electrode formed over the gate insulating film to fill up the recess channel region.

2. The semiconductor device according to claim 1, wherein the recess channel region includes a portion of a storage node region and a channel region adjacent thereto in a longitudinal direction of the active region.

3. The semiconductor device according to claim 1, further comprising source/drain regions formed on a silicon layer grown by using the semiconductor substrate at both sides of the gate electrode as a seed layer.

* * * * *